(12) United States Patent
Itoh et al.

(10) Patent No.: US 6,359,677 B2
(45) Date of Patent: *Mar. 19, 2002

(54) STAGE APPARATUS, EXPOSURE APPARATUS USING THE SAME, AND A DEVICE MANUFACTURING METHOD

(75) Inventors: Hiroshi Itoh, Fuchu; Nobushige Korenaga, Utsunomiya, both of (JP)

(73) Assignee: Canon Kabushiki Kaisha, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/210,801

(22) Filed: Dec. 15, 1998

(30) Foreign Application Priority Data

Dec. 26, 1997 (JP) .............................. 9-359807

(51) Int. Cl.[7] ...................... G03B 27/42; G03B 27/52; G03B 27/58; G05B 11/32; G05B 11/01
(52) U.S. Cl. .............................. 355/53; 355/55; 355/72; 318/625; 318/628; 318/687
(58) Field of Search .............................. 355/53, 55, 72; 318/625, 628, 687

(56) References Cited

U.S. PATENT DOCUMENTS

| 3,940,676 A | 2/1976 | Dudley ...................... 318/612 |
| 5,153,494 A | * 10/1992 | Hollis ...................... 318/560 |
| 5,204,712 A | * 4/1993 | Bouwer et al. ................ 355/53 |
| 5,260,580 A | 11/1993 | Itoh et al. ................ 250/492.2 |
| 5,467,720 A | 11/1995 | Korenaga et al. ............. 108/20 |
| 5,518,550 A | 5/1996 | Korenaga et al. ........... 118/729 |
| 5,528,118 A | * 6/1996 | Lee ....................... 318/568.17 |
| 5,610,686 A | * 3/1997 | Osanai ........................ 355/72 |
| 5,684,856 A | 11/1997 | Itoh et al. ..................... 378/34 |
| 5,773,951 A | * 6/1998 | Markowski et al. ........ 318/652 |
| 5,841,250 A | 11/1998 | Korenage et al. ........... 318/135 |
| 5,909,272 A | * 6/1999 | Osanai ........................ 355/53 |

* cited by examiner

*Primary Examiner*—Russell Adams
*Assistant Examiner*—Khaled Brown
(74) *Attorney, Agent, or Firm*—Fitzpatrick, Cella, Harper & Scinto

(57) ABSTRACT

A stage apparatus includes a base having a reference plane, a stage mounted on the base, a plurality of static-pressure bearings forming a gap between the reference plane and the stage, a plurality of preloading mechanisms producing a preload between the stage and the reference plane, a guideless motor for driving the stage, and a controller for controlling driving of the stage in (i) at least one of a direction perpendicular to the reference plane and in a tilting direction by controlling at least one of the static-pressure bearings and the preloading mechanism, and (ii) in a direction within the reference plane by the guideless motor. Positioning of the stage in a Z-direction and in tilting directions can be carried out by electromagnets and air pads. Positioning in directions (X, Y, θ) within a plane parallel to the reference plane of the base can be accomplished by guideless motors.

33 Claims, 10 Drawing Sheets

STAGE APPARATUS, EXPOSURE APPARATUS USING THE SAME, AND A DEVICE MANUFACTURING METHOD

BACKGROUND OF THE INVENTION

1. Field of the Invention

The present invention relates to a stage apparatus for performing positioning by mounting an object, and particularly, to a stage apparatus suitably applicable to a semiconductor exposure apparatus. The invention also relates to an exposure apparatus using the aforementioned stage apparatus and a device manufacturing method for manufacturing a device, such as a semiconductor device, using such an exposure apparatus.

2. Description of the Related Art

FIG. 10 is a schematic diagram of a wafer stage of a conventional semiconductor exposure apparatus. Three translational axes (X, Y and Z directions) relative to a reference coordinate system and three rotational axes ($\theta_x$, $\theta_y$, $\theta_z$) around the three translational axes, respectively, will hereinafter be referred to as six degree-of-freedom positions.

In FIG. 10, reference numeral 41 represents a base supported on a floor F via dampers 51A and 51B; and 43 a Y-stage movable in the Y-direction on a reference plane on the base 41 by the action of a Y-linear motor 46 producing a thrust in the Y-direction along a fixed guide 42 fixed to the base 41. The base 41 and the fixed guide 42 are not in contact with the Y-stage 43, being connected by air pads 44a to 44c serving as static-pressure bearings. The Y-stage 43 has an X-direction guide, and guides X-stage 45 mounted on the Y-stage 43 in the X-direction. An X-linear motor stator producing a force in the X-direction is provided on the Y-stage 43 and drives, together with the X-linear motor movable part (rotor), the X-stage 45 in the X-direction. The base 41 and the X-guide are connected by an air pad serving as a static pressure bearing with the X-stage 45, and are not in contact therewith.

A tilting stage 48 is mounted on the X-stage 45. The tilting stage 48 travels in the Z-direction and rotates in the three rotational axes ($\theta_x$, $\theta_y$, $\theta_z$) directions by the thrust produced by a motor (not shown). A stage substrate 51 including a wafer chuck is mounted on the tilting stage 48 to hold a wafer 53, which is an object to be exposed. A measuring mirror for measuring positions in the X-direction and the Y-direction is provided on the stage substrate. (Only measuring mirror 49a for measuring in the X-direction and Y-direction is shown.)

The stage apparatus of a semiconductor exposure apparatus performs positioning using the six degree-of-freedom positions in the in-plane directions (X, Y, $\theta_z$) and in the vertical directions (Z, $\theta_x$, $\theta_y$), and performs exposure for a chip. Positions in the in-plane direction (X, Y, $\theta_z$) are measured with a laser interferometer 50 integral with a lens mirror cylinder (not shown). For positions in the tilting directions (Z, $\theta_x$, $\theta_y$), a position in the Z-direction and an angle of the rotational component are measured with an alignment measuring system (not shown), integral with the lens mirror cylinder.

In FIG. 10, the laser interferometer 50 is connected to the base 41 on the assumption that the lens mirror cylinder (not shown) is integral with the base 41. Although the measuring instrument for the Z-direction is omitted, it is possible to measure positions in the tilting directions (Z, $\theta_x$, $\theta_y$) by measuring three points on the substrate stage or the wafer from the lens mirror cylinder.

Positioning in the six-axis directions is accomplished by providing a servo system for each axis. Drive instruction values to a Y-direction linear motor and an X-direction linear motor serving as actuators for the X-direction and the Y-direction of the stage are calculated with a compensator on the basis of positional information of the laser interferometer 50 to drive the X-stage and the Y-stage, respectively. The tilting stage 48 is driven by calculating drive instruction values by the compensator to an actuator for the tilting stage 48 in response to measured values of the Z-direction position, the angles in the rotating directions ($\theta_x$, $\theta_y$) and in the $\theta_z$-direction.

It is thus possible to control the six degree-of-freedom positions of the three translational axes (X, Y, Z) and the three rotational axes to arbitrary positions relative to the lens mirror cylinder serving as a reference point of the stage, thus permitting highly accurate positioning.

In the stage apparatus of such a semiconductor exposure apparatus, a high positioning accuracy is required because of a high resolution of the line width to be exposed. Also, the semiconductor exposure apparatus, being production equipment, is required to provide a high throughput. In order to satisfy this requirement, it is necessary to have a high response of the servo system of the stage, and to be capable of traveling at a high speed. In order to improve the response of the servo system, the mechanical system of the stage must have a high rigidity. With a low rigidity of the stage, it is impossible to improve the band of the servo system, and inability to rapidly respond to a target position decreases throughput. A low band of the servo system results in a decrease in the ability to inhibit disturbances, and makes it impossible to accomplish highly accurate positional control.

The aforementioned conventional stage is composed of a base supporting the entire stage apparatus, a Y-stage conducting travel in the Y-direction, an X-stage conducting travel in the X-direction, a tilting stage conducting travel in the tilting direction and a substrate stage for holding a wafer, these stages forming a unit, thus leading to a lower mechanical rigidity. This arrangement, however, creates a resonance point determined by the rigidity of air portions connecting these stages and the mass of the configuration. The stage system, therefore, has a servo band restricted by this resonance point, and cannot improve response.

SUMMARY OF THE INVENTION

The present invention has an object to provide a high-speed and high-accuracy stage apparatus having a wide servo band by achieving a higher resonance point of the mechanical system thereof in a simple configuration with a positionally controllable stage.

The stage apparatus includes a base having a reference plane, a stage mounted on the base, a plurality of static-pressure bearings forming a gap between the reference plane and the stage, a plurality of preloading mechanisms producing a preload between the stage and the reference plane, a guideless motor for driving the stage, and a controller for controlling driving of the stage in (i) at least one of a direction perpendicular to the reference plane and in a tilting direction by controlling at least one of the static-pressure bearings and the preloading mechanism, and (ii) in an in-plane direction by the use of the guideless motor.

The above-mentioned stage should preferably have a monolithic structure.

It is desirable to control positions in the direction perpendicular to the reference plane of the stage and in the tilting direction by controlling the preloading mechanism.

In another aspect, the present invention provides an exposure apparatus that includes a base having a reference plane, a stage mounted on the base, a plurality of static-pressure bearings forming a gap between the reference plane and the stage, a plurality of preloading mechanisms producing a preload between the stage and the reference plane, a guideless motor for driving the stage, a controller for controlling driving of the stage in (i) at least one of a direction perpendicular to the reference plane and in a tilting direction by controlling at least one of the static-pressure bearings and the preloading mechanism, and (ii) in a direction within the reference plane by the guideless motor, and an exposure apparatus for exposing a device held by the stage.

In yet another aspect, the present invention provides a device manufacturing method that includes providing a base having a reference plane, mounting a stage on the base, forming a gap between the reference plane and the stage by a plurality of static-pressure bearings, producing a preload between the stage and the reference plane by a plurality of preloading mechanisms, driving the stage by a guideless motor, controlling, using a controller, driving of the stage in (i) at least one of a direction perpendicular to the reference plane and in a tilting direction by controlling at least one of the static-pressure bearings and the preloading mechanism and (ii) in a direction within the reference plane by the guideless motor, and exposing a wafer, mounted on the stage, to a pattern on a mask to produce a device.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

DESCRIPTION OF THE PREFERRED EMBODIMENTS

Preferred embodiments of the present invention will now be described in detail in accordance with the accompanying drawings.

First Embodiment

Figure 1:
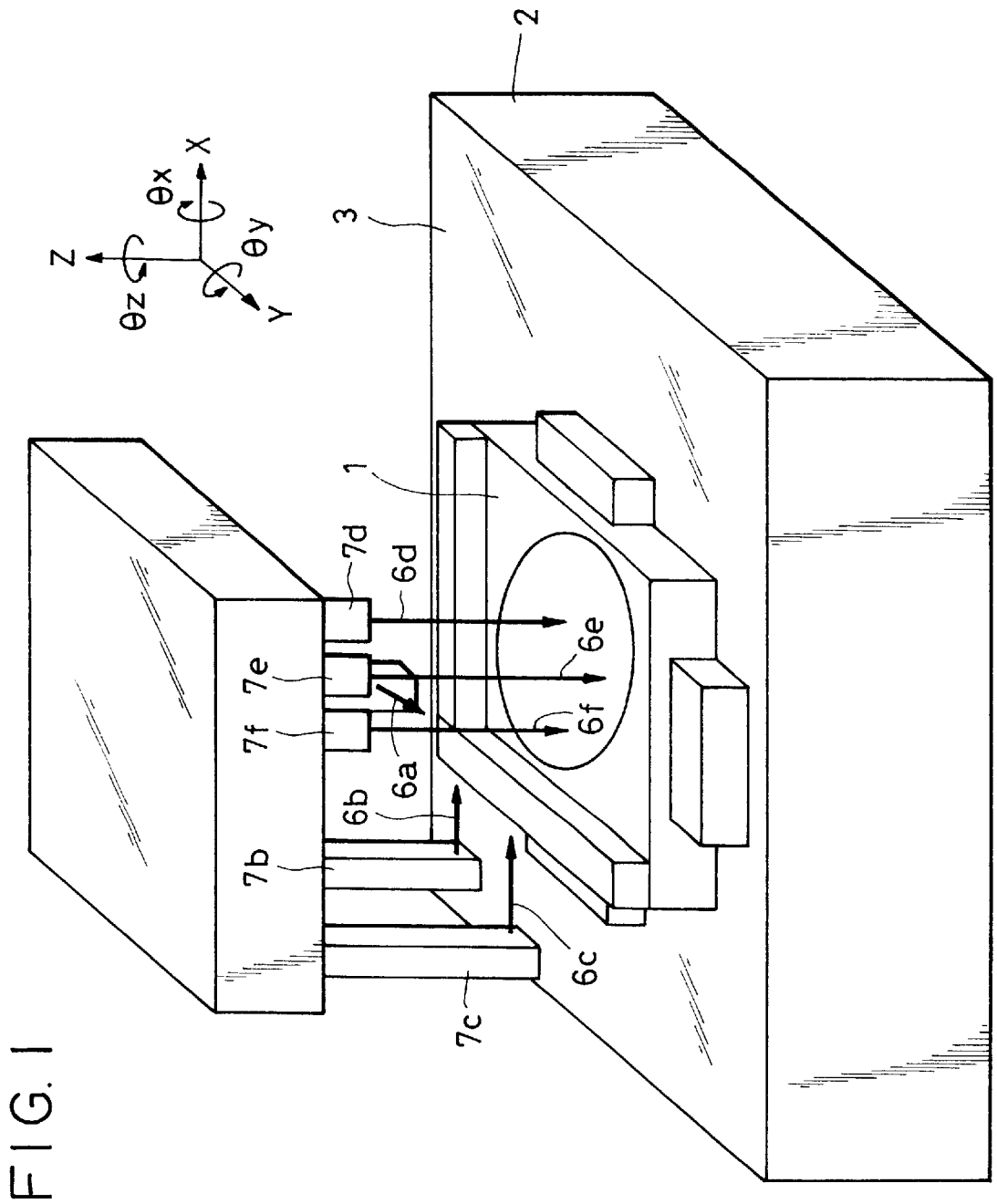
FIG. 1 is a schematic view of a stage apparatus of a first embodiment of the present invention.
Figure 2B:
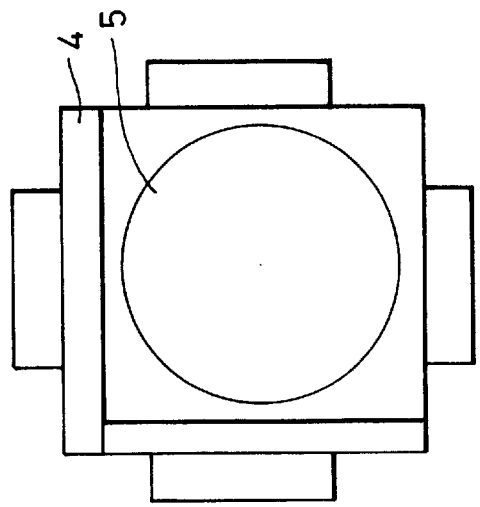
FIGS. 2A through 2D are schematic views of a stage substrate of the stage apparatus of the first embodiment of the invention.
Figure 2C:
Figure 2A:
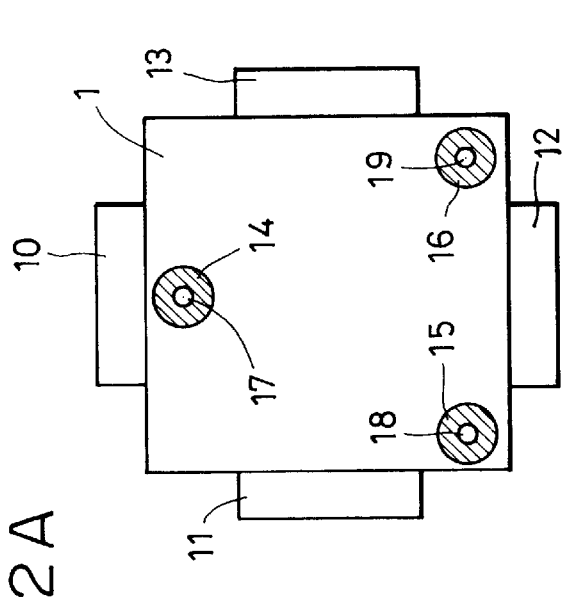
Figure 2D:
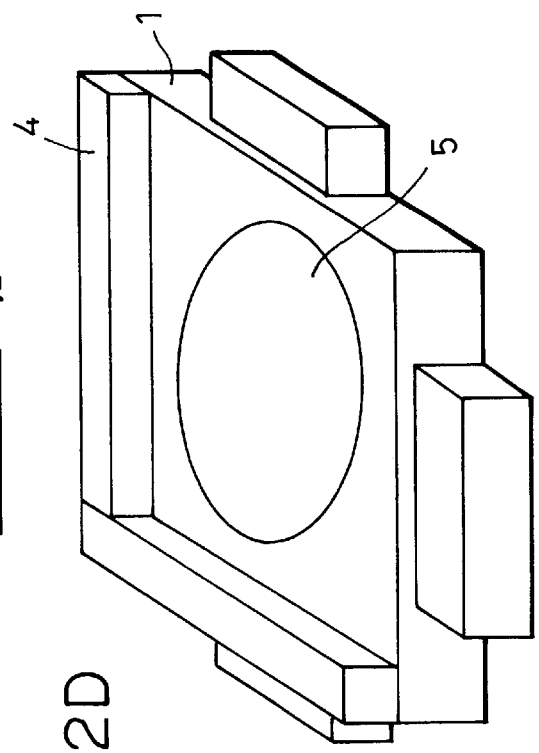

FIG. 1 is a schematic diagram of a stage apparatus of the invention. In FIG. 1, reference numeral 1 represents a substrate stage; 2 a base, supported by a damper (not shown); and 7a to 7f measuring instruments for measuring at least six positions for determining the six degree-of-freedom positions of the stage 1. Positions in the in-plane directions (X, Y, $\theta_z$) are measured by the use of laser interferometers (in-plane position measuring instruments) 7a to 7c, integral with a lens barrel. For tilting directions in a direction perpendicular to the reference plane and rotating directions (Z, $\theta_x$, $\theta_y$) having axes within the reference plane, the position in the Z-direction and the angle of the rotational component are measured by alignment meters (vertical position measuring instruments) integral with the lens barrel, formed integrally with the measuring instruments 7a to 7f, for determining the six degree-of-freedom positions of the stage and may be provided integrally with the base or may be vibration-removed from the base by a damper.

FIGS. 2A through 2D illustrate a configuration of a substrate stage serving as the stage main body of the present invention. In these figures, reference numeral 1 represents the substrate stage main body. As shown in these figures, the stage 1 is composed of a single substrate stage to provide a monolithic structure. A mirror 4 for reflecting a laser beam of the laser interferometers 7a to 7c (shown in FIG. 1), for detecting a position in the horizontal direction and a wafer chuck 5 for holding a wafer, are provided on the upper surface of this stage. Air pads 17 to 19 serving as static-pressure bearings for creating a gap between the reference plane 3 of the base 2 and the stage 1 by discharging air, and electromagnets 14 to 16 serving as preloading mechanisms for producing a preload between the stage and the reference plane are provided on the lower surface of the substrate stage 1. The base 2 is, therefore, made of a magnetic material such as steel so as to be attracted by the electromagnets. Although the air pads and the electromagnets are arranged at the same positions, the arrangement of the air pads and the electromagnets is not limited to this arrangement.

Needles (rotors) 10 to 13 of an induction motor serving as a guideless motor for driving the substrate stage 1 are provided on four sides of the substrate stage 1. In this case, the base 2 plays the role of a stator.

In this embodiment, by driving two opposite induction motors (10 and 12, for example) from among the four induction motors 10 to 13 provided on the substrate stage 1 in reverse directions, it is possible to achieve driving in the rotating direction ($\theta_z$) around a direction vertical to the reference plane 3 of the base 2. That is, the substrate stage 1 can be positioned in the desired directions within the reference plane 3 (X, Y, $\theta_z$) of the base 2 by driving the plurality of induction motors 10 to 13.

Since the substrate stage 1 is driven in directions (X, Y, $\theta_z$) within the reference plane 3 of the base 2 by the use of the induction motors 10 to 13, the number of induction motors 10 to 13 should preferably be at least three. The number of induction motors, which may be four, as in this embodiment, is, therefore, not limited to four.

As described above, the base 2 is made of a magnetic material such as steel. The base 2 is made of a magnetic material in order to produce an attraction force by feeding current to the electromagnets 14 to 16. Relative to the induction motors 10 to 13 producing a thrust in directions (X, Y, $\theta_z$) within the reference plane 3 of the base 2, the base 2, serving as a stator, must be conductive. For properly feeding current, the conductor should preferably be a conductive material having the smallest possible electrical resistance. It is, therefore, desirable to form a surface layer of the base 2 from a conductive material having a small electrical resistance, such as aluminum or copper, and a layer thereunder from a magnetic material. The base material is not, however, limited to this. With this configuration, current necessary for the induction motors 10 to 13 of the base can be minimized, thus providing a stage apparatus having a high efficiency with small heat generation.

Figure 3:
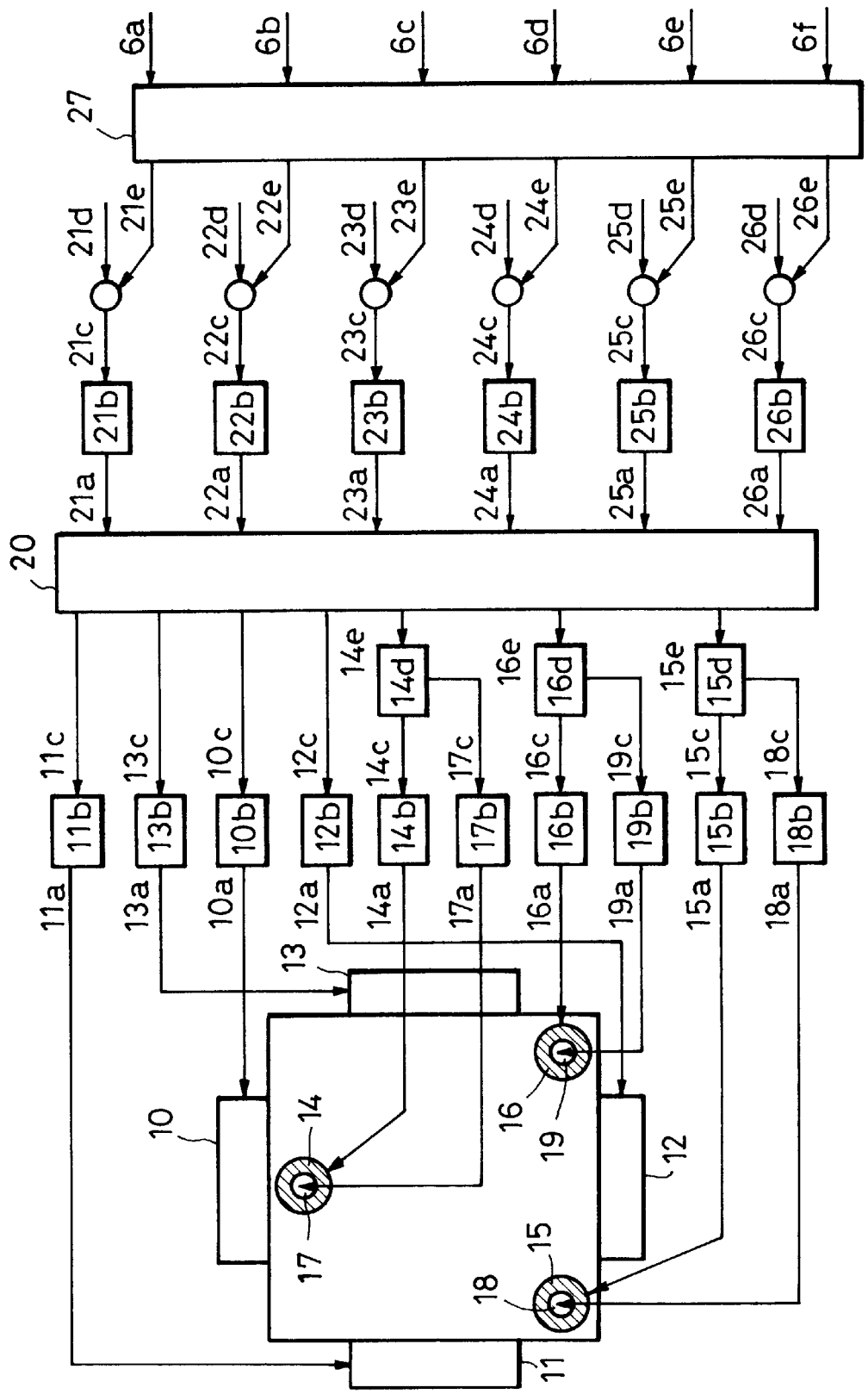
FIG. 3 is a configuration diagram of a servo system of the stage apparatus of the first embodiment of the invention.
Figure 4A:
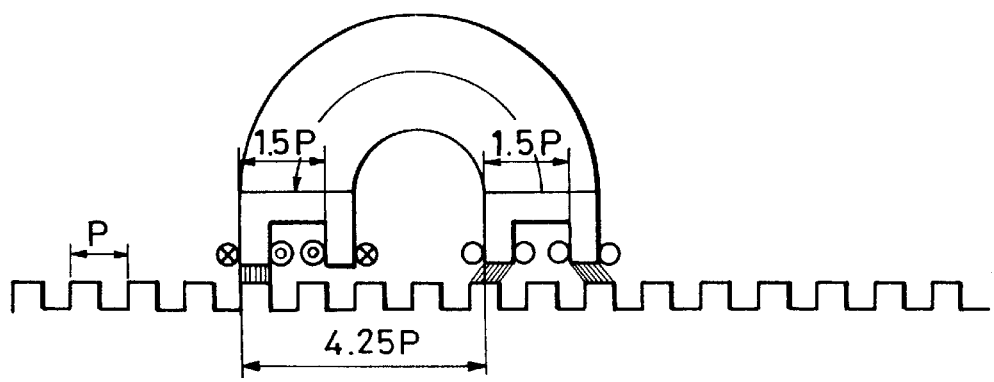
FIGS. 4A through 4D are descriptive views of the principle of driving a flat pulse motor used in a stage apparatus of a second embodiment of the invention.
Figure 4B:
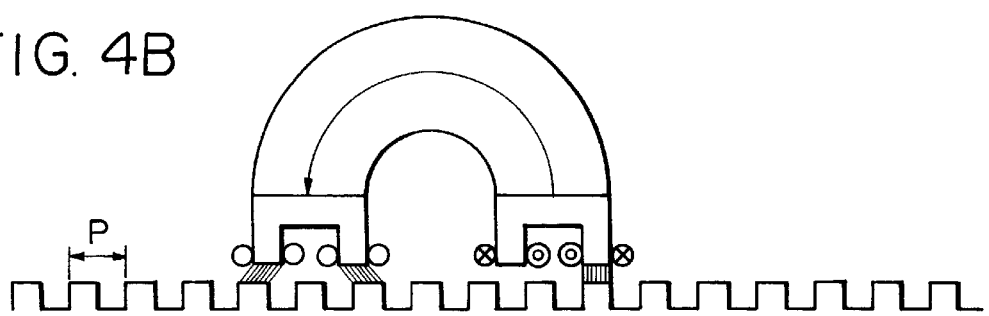
Figure 4C:
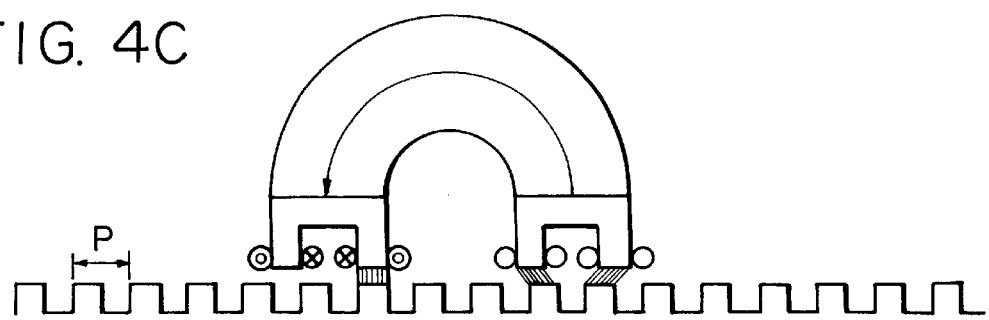
Figure 4D:
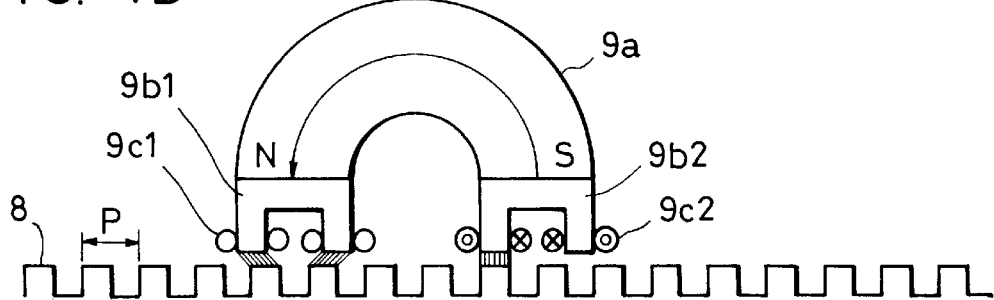

FIG. 3 illustrates a configuration of a servo system of the stage apparatus of the present invention. Operations of this servo system will now be described.

First, target position instruction values (21d to 26d) for the six axes (X, Y, Z, $\theta_x$, $\theta_y$, $\theta_z$) relative to coordinates of the reference position are given. Six values of stage position information (6a to 6f) measured from a coordinate system at the reference position are converted by a noninteracting compensator 27 into values of the current positions (21e to 26e) of coordinate systems for the six degrees-of-freedom. Differences (21c to 26c) between the target position instruction values and the current positions measured from the reference position are determined and entered into compensators (21b to 26b). A PID compensator is usually used as this type of compensator. Values of thrust for the six axes are determined at this point, and values of instructed thrust to the actuator are determined from these values of thrust and from noninteracting compensator 20.

Feeding current to the induction motor needles (rotors) 10 to 13 produces thrust in the directions (X, Y, $\theta_z$) within the reference plane 3 of the base 2. The values of current (10a to 13a) fed to the induction motor needles (rotors) are calculated from the target thrust and supplied by drives (10b to 13b). Thrust in the direction (Z) perpendicular to the reference plane 3 and thrust in the tilting directions ($\theta_x$, $\theta_y$) are controlled by means of electromagnets (14 to 16) and air pads (17 to 19). Thrust in a direction away from the reference plane 3 of the base 2 is controlled by means of pressure and air flow rate (17a to 19a) via valves (17b to 19b), and thrust in a direction toward the reference plane 3 is controlled by feeding current (14a to 16a) to the electromagnets (14 to 16) via drivers (14b to 16b).

For controlling the position of the substrate stage 1 in a direction (Z) perpendicular to the reference plane and tilting directions ($\theta_x$, $\theta_y$), the number of the electromagnets and static-pressure bearings should preferably be at least three, but is not limited to three.

Blocks (14d to 16d) are vertical thrust determiners for determining which of the electromagnets (14 to 16) or the air pads (17 to 19) are to be driven in accordance with a positive or negative target thrust. When values of the target thrust determined by the vertical thrust determiners (14d to 16d) are in a direction toward the stage base, the substrate stage 1 is driven by feeding current (14a to 16a) by the drivers (14b to 16b) to the electromagnets (14 to 16). When target values of the thrust are in a direction away from the base, the substrate stage 1 is driven by feeding air (17a to 19a) via valves (17b to 19b). Upon application of the thrust, the stage 1 travels, and the position thereof at this point is measured by the measuring instrument. The measured position is fed back, and the same operations are repeated.

According to this embodiment, it is possible to position the substrate stage 1 in a direction (Z) perpendicular to the reference plane of the base and in tilting directions ($\theta_x$, $\theta_y$) by controlling the thrust produced from the air pads (static-pressure bearings) and the electromagnets (preloading means) provided on the substrate stage 1. It is, therefore, possible to position Z-tilting of a wafer, which is the object of exposure with a simpler configuration as compared to the conventional art, thus providing a stage apparatus having lighter weight and smaller size.

Along with this, it is possible to move the substrate stage 1, which has a monolithic structure in six-axis directions (X, Y, Z, $\theta_x$, $\theta_y$, $\theta_z$) by using induction motors for driving the substrate stage 1 in the directions (X, Y, $\theta_z$) within the reference plane 3 of the base 2. This improves the conventional laminated stage apparatus, and permits improvement of rigidity of the stage apparatus. It is possible to improve the response of the servo system, ensuring a rapid response to a target position. Thus, it is possible to provide a high-speed and high-accuracy stage apparatus.

The surface layer of the base 2 is made of a material having a low electrical resistance, such as aluminum, and the layer thereunder is made of a magnetic material. This minimizes the current that is required by the induction motor of the base 2. As a result, a stage apparatus having a high energy efficiency with little heat generation is provided.

Second Embodiment

In the aforementioned embodiment, the induction motors have been used for driving in directions (X, Y, $\theta_z$) within the reference plane 3 of the base 2. In the present embodiment, also, four guideless motors are provided for the substrate stage 1, as in the preceding stage apparatus, provided that, in the present embodiment, flat pulse motors, with which it is easier to obtain a larger thrust than with induction motors, are used as the guideless motors.

Because the stage apparatus of this embodiment has the same configuration as in the preceding embodiment, a further description thereof is omitted here.

The principle of driving a general flat pulse motor is illustrated in FIGS. 4A through 4D.

First, fixed teeth 8 having a pitch P are provided on the upper surface of the base 2 in the present embodiment. A needle (rotor) of the flat pulse motor is composed of a permanent magnet 9a, a movable tooth 9b1, another movable tooth 9b2, and coils 9c1 and 9c2 wound on the individual movable teeth. Each of the movable teeth 9b1 and 9b2 is composed of a pair of small teeth spaced apart from each other by 1.5 P (i.e., spaced apart by 180° with respect to an electrical angle, with the pitch P as a reference). The movable teeth 9b1 and 9b2 are connected by the permanent magnet 9a provided as shown. The movable tooth 9b1 and the movable tooth 9b2 have a positional shift of 4.25 P (i.e., an electrical angle of 90°). For each of the movable teeth 9b1 and 9b2, the coils 9c1 and 9c2 are wound to form a counterphase to the two small teeth so that one of the two small teeth is magnetized vertically upward, and the other, vertically downward.

In this configuration, the coils 9c1 and 9c2 are magnetically excited in the sequence shown in FIGS. 4A through 4D, and the flow of magnetic flux of the permanent magnet 8 is sequentially distributed. The pulse motor needle (rotor), as a whole, moves in one direction. These figures show the principle of the motor based on a current variation in four steps. Actually, however, the motor is operated as a synchronous motor by continuously following the four steps with a sinusoidal current waveform to ensure continuous travel. While these figures illustrate a one-dimensional operation, the fixed teeth 8 provided on the base 2 are not actually comb-shaped, but take a lattice form, thus permitting operations as shown, in the X and Y-directions.

In this embodiment, by driving two opposite pulse motors (10 and 12, for example) from among the four pulse motors 10 to 13 provided on the substrate stage 1 in reverse directions, it is possible to achieve driving in the rotating direction ($\theta_z$) around a vertical direction with respect to the reference plane 3 of the base 2. That is, the substrate stage 1 can be positioned in the directions within the reference plane (X, Y, $\theta_z$) of the base 2 by driving the plurality of pulse motors 10 to 13.

Since the substrate stage 1 is driven in directions (X, Y, $\theta_z$) within the reference plane 3 of the base 2 by the use of the pulse motors 10 to 13, the number of pulse motors should preferably be at least three. The number of pulse motors in this embodiment is four. This number, however, is not limited to four.

An air jet port from the static-pressure bearings 17 to 19 is provided between the fixed teeth and the motor needles (rotors). To ensure a stable air flow, recesses of the fixed teeth 8 are filled with a resin to achieve a mechanically flat, but magnetically concave/convex surface.

The servo system is the same as that in the preceding first embodiment, so that the flat pulse motor is controlled in place of the induction motor.

The same advantages as in the preceding embodiment can be expected. It is possible to position the substrate stage 1 in a direction (Z) perpendicular to the reference plane of the base 2 and in tilting directions ($\theta_x$, $\theta_y$) by controlling the thrust produced from the air pads (static-pressure bearings) and the electromagnets (preloading mechanism) provided on the substrate stage 1. It is, therefore, possible to position in the Z and tilting directions of a wafer, which is the object of exposure, with a simpler configuration as compared to the conventional art, thus permitting a stage apparatus of lighter weight and smaller size.

Along with this, it is possible to move the substrate stage 1, which has a monolithic structure, in six-axis directions (X, Y, Z, $\theta_x$, $\theta_y$, $\theta_z$) by using pulse motors for driving the substrate stage in directions (X, Y, $\theta_z$) within the reference plane 3 of the base 2. This improves the conventional laminated stage apparatus, and improves rigidity of the stage apparatus. Also, it is possible to improve the response of the servo system, ensuring rapid response to a target position. Thus, it is possible to provide a stage apparatus having high-speed and high-accuracy.

Third Embodiment

In the preceding stage apparatus, the ascending force of the stage substrate has been controlled through the control of the static-pressure bearings. It is, however, difficult to accurately control an ascending force or positioning of the stage substrate through the control of air. This is caused by a low response of air, in general. In the present embodiment, therefore, air of the static-pressure bearings is used for production of the ascending force to a certain degree, and control of the ascending force, the descending force and positioning of the stage substrate are accomplished by means of the electromagnets. Driving in the directions within the reference plane 3 of the base 2, in this embodiment, may be by means of induction motors or by means of flat pulse motors.

While air is injected under a certain pressure or at a certain flow rate, a certain offset current is fed to the electromagnets to generate a preload sufficient to offset the ascending force of air, and the position of balance is used as the origin in the vertical direction. When the current instruction value to be fed to the electromagnets is expressed as a sum of the offset current and the control instruction value, the control instruction value becomes negative when causing the stage substrate to descend from the foregoing stage origin, and when causing the stage substrate to ascend, on the contrary, the control instruction value becomes positive, thus permitting control of the thrust in the vertical direction. According to this practice, control of the force in a direction (Z) at right angles to the stage substrate and in tilting directions ($\theta_x$, $\theta_y$) can be adjusted by means of electromagnets. This provides a stage apparatus having a higher response than in the practice based on air control. This provides another advantage of a simpler air control system.

Figure 5:
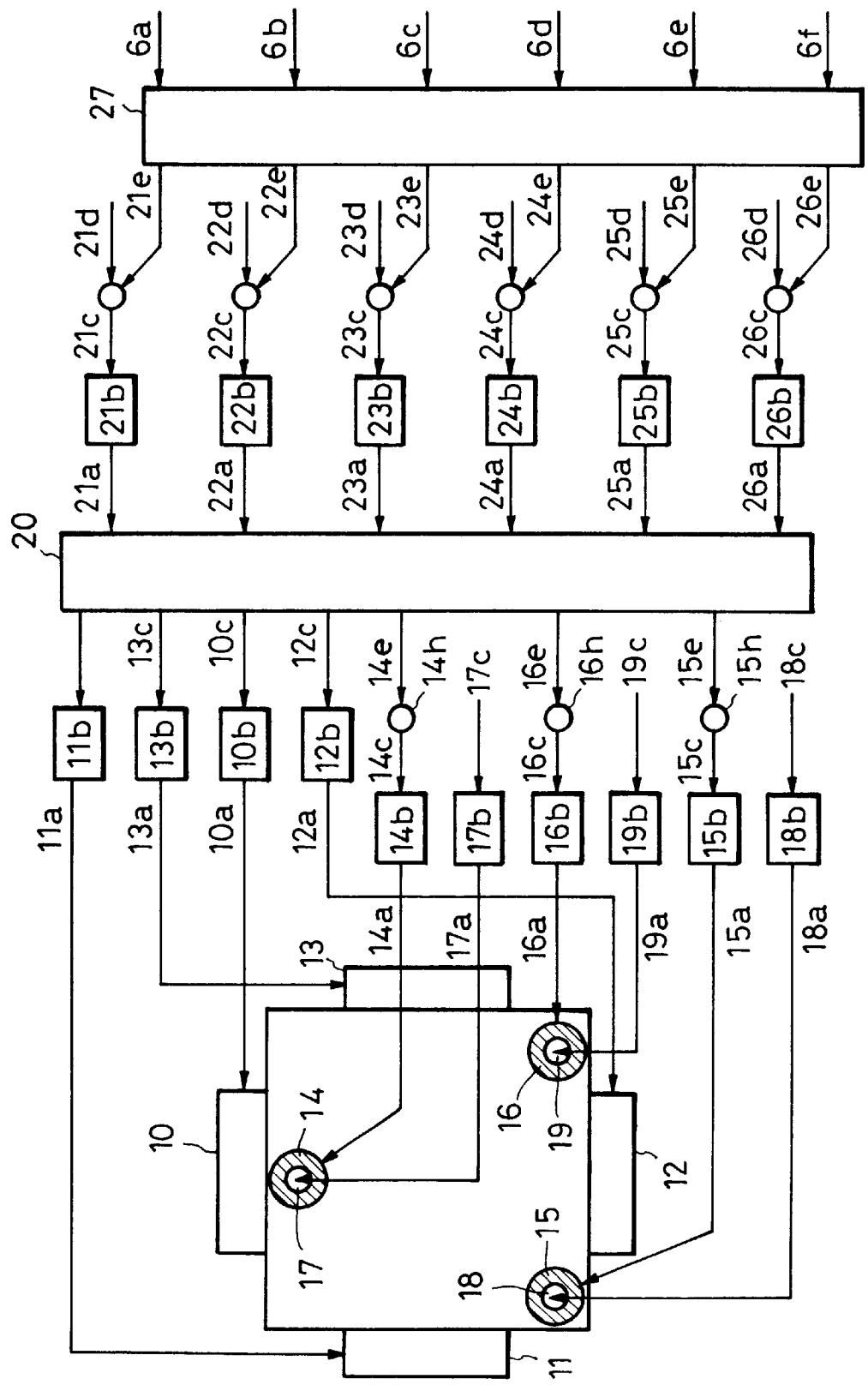
FIG. 5 is a configuration diagram of a servo system of a stage apparatus of a third embodiment of the invention.

FIG. 5 illustrates a configuration of a servo system of the second embodiment of the invention.

First, target position instruction values (21d to 26d) for the six axes (X, Y, Z, $\theta_x$, $\theta_y$, $\theta_z$) relative to coordinates of the reference position are given. Six values of stage position information (6a to 6f) measured from a coordinate system at the reference position are converted by a noninteracting compensator 27 into values of the current positions (21e to 26e) of coordinate systems for the six degrees-of-freedom. Differences (21c to 26c) between the target position instruction values and the current positions measured from the reference position are determined and entered into compensators (21b to 26b). A PID compensator is usually used as such a compensator. Values of thrust for the six axes (21a to 26a) are determined at this point, and values of instructed thrust to the actuator are determined from these values of thrust and the noninteracting compensator 20. Feeding current to the induction motor (or flat pulse motor) rotors (10 to 13) produces thrust in the directions (X, Y, $\theta_z$) within the reference plane of the base. Values of current (10a to 13a) fed to the induction motor rotors are calculated from the target thrust and supplied by drivers (10b to 13b). Thrust in the direction (Z) perpendicular to the reference plane and thrust in the tilting directions ($\theta_x$, $\theta_y$) are controlled by means of electromagnets (14 to 16). Current instruction values (14a to 16a) of thrust in a direction (Z) perpendicular to the reference plane 3 of the base 2 and tilting directions ($\theta_x$, $\theta_y$) are determined by adding offset current (14h to 16h) to the thrust instruction values (14e to 16e). At this point, air (17a to 19a) of air pads (17 to 19), serving as static-pressure bearings, is fed through valves (17b to 19b) under a certain pressure at a certain flow rate as specified by air instruction values (17c to 19c).

According to the stage apparatus of this embodiment, in which the supply of air for the static-pressure bearings is kept constant at a certain level, and positional control in a direction (Z) perpendicular to the reference plane 3 of the base 2 and in tilting directions ($\theta_x$, $\theta_y$) is accomplished by the electromagnets, it is possible to conduct highly accurate positioning with a high response. Because air supply is constant and satisfactory, the design of the mechanical and control systems for the supply of air can be simplified, thereby providing a stage apparatus having a lighter weight, a smaller size and a lower cost.

Fourth Embodiment

Figure 6:
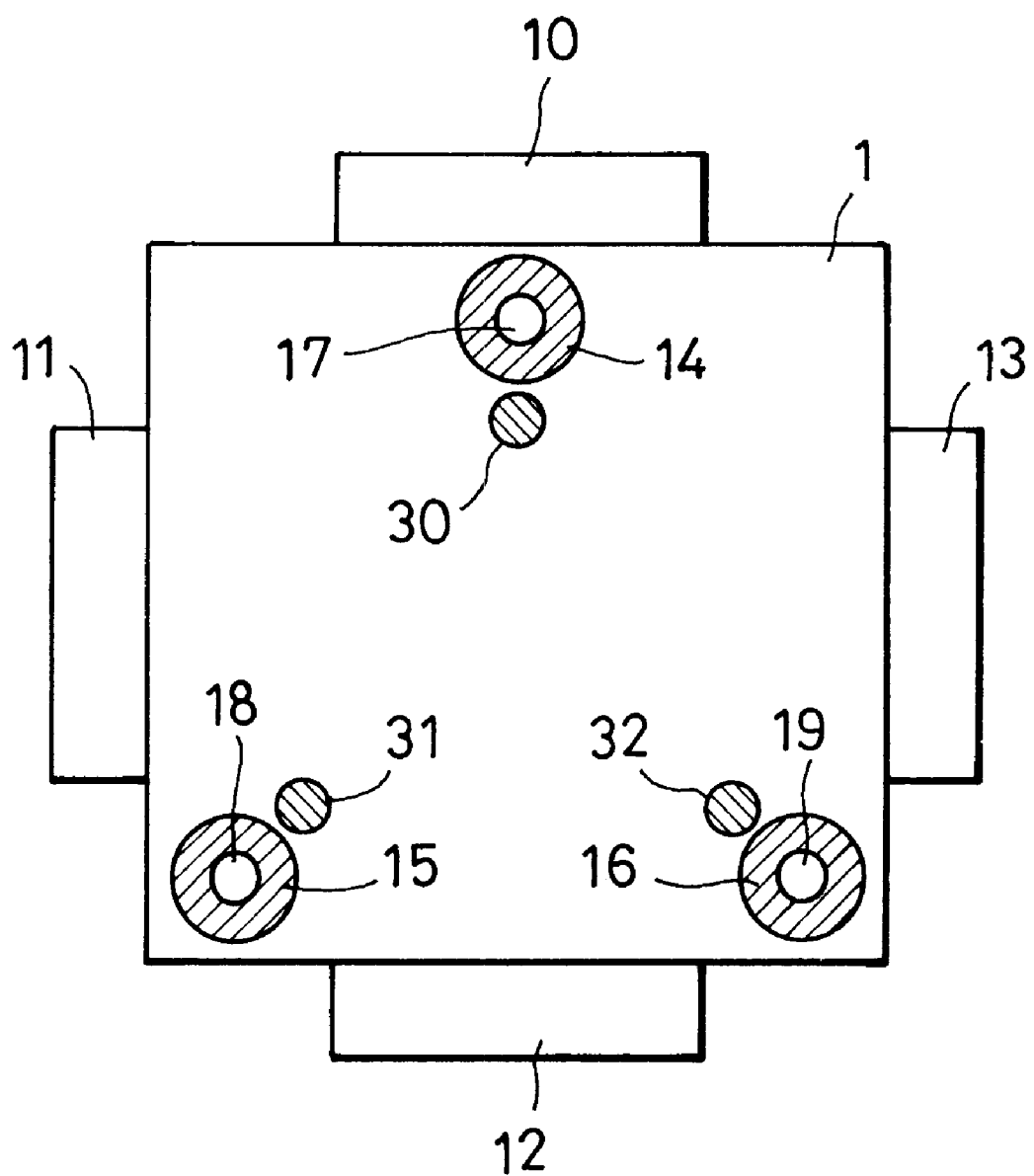
FIG. 6 is a schematic view of a substrate stage of a stage apparatus of a fourth embodiment of the invention.

FIG. 6 illustrates a substrate stage of a fourth embodiment of the invention. Air pads (17 to 19) serving as static-pressure bearings and electromagnets (14 to 16) provided on the back of the substrate stage 1 are the same as in the preceding embodiment. Therefore, a further description is omitted here. A description of an induction motor or a flat pulse motor provided on a side of the stage substrate 1, being the same as in the preceding embodiment, is also omitted.

Gap measuring gauges (30 to 32) for measuring the gap in the vertical directions (Z, $\theta_x$, $\theta_y$) between the substrate stage 1 and the base 2 are provided on the back of the substrate stage of the present embodiment. This permits accurate measurement of the positional relationship in the vertical direction between the substrate stage 1 and the base 2.

Since induction motors (10 to 13) are used for driving in the in-plane directions (X, Y, $\theta_z$) in the present invention, a change in the gap between the base 2 and the substrate stage 1 leads to a change in the distance between the stators of the induction motors and the rotors of the induction motors provided on the stage substrate, hence to a change in the motor thrust. If the gap in the vertical direction can be measured, it is possible to determine the thrust applied to the substrate stage 1. Because the thrust in directions (X, Y, $\theta_z$) within the reference plane 3 of the base 2 is generated by the induction motors, it is possible to linearize the thrust produced by the induction motors relative to the target thrust instruction value by vector control by measuring the plane direction positional relationship between the stage having the induction motors and the base 2 serving as a stator. It is also possible to estimate a variation in the thrust generated by the induction motors from the measured results, and to control the thrust instruction value of the induction motors and the preload of the preloading mechanism. Further, it is possible to provide a stage apparatus that is not susceptible to any influence of base vibration, by controlling the current of the electromagnets, so as to remove a vibration component of the base 2, on the basis of the measured results.

Fifth Embodiment

Figure 7:
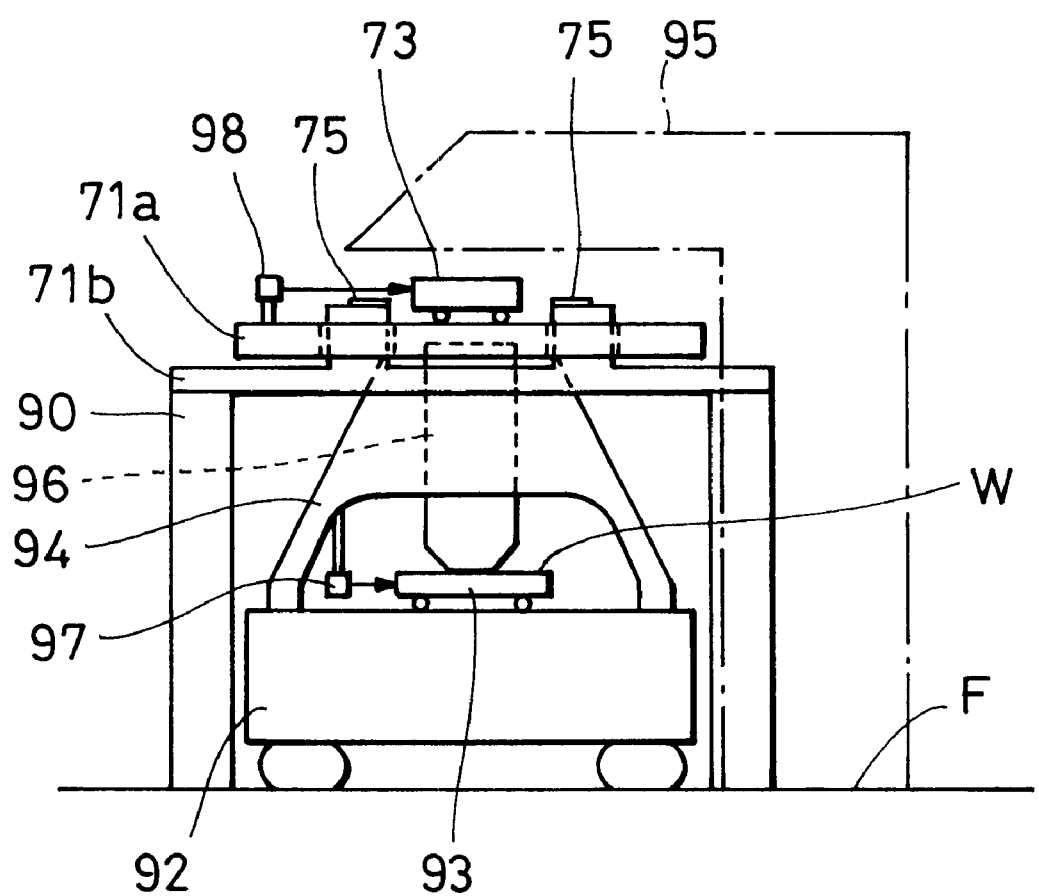
FIG. 7 is a schematic view of an exposure apparatus of a fifth embodiment of the invention.

An embodiment of a scanning type exposure apparatus mounting one of the stage apparatuses of the aforementioned embodiments as a reticle stage or a wafer stage will now be described with reference to FIG. 7.

A reticle stage base 71a supporting a reticle stage 73 is integral with a frame 94 provided on a base 92 supporting a wafer stage 93. Exposure light for exposing a wafer W on the wafer stage 93 via a reticle on the reticle stage 73 is produced from a light source 95 (shown by a broken line).

The frame 94 supports the reticle stage base 71a, and also supports a projection optical system 96 between the reticle stage 73 and the wafer stage 93. Since a stator 75 of a linear motor, which accelerates and decelerates the reticle stage 73, is supported by the frame 94 and a separate supporting frame 90, a reaction force to the driving force of the motor of the reticle stage 73 is transferred to the wafer stage 93. There is, therefore, no risk of causing a disturbance of the driving section, or causing vibration of the projection optical system 96.

The wafer stage 93 is scanned in synchronization with the reticle stage 73 by the driving section. During scanning of the reticle stage 73 and the wafer stage 93, the positions of these stages are continuously detected by interferometers 97 and 98, and the results of the detection are fed back to the driving sections of the reticle stage 73 and the wafer stage 93, respectively. It is, therefore, possible to accurately synchronize the scanning starting positions of these stages, and at the same time, to control the scanning speed in the constant-speed scanning area at a high accuracy.

Sixth Embodiment

Figure 8:
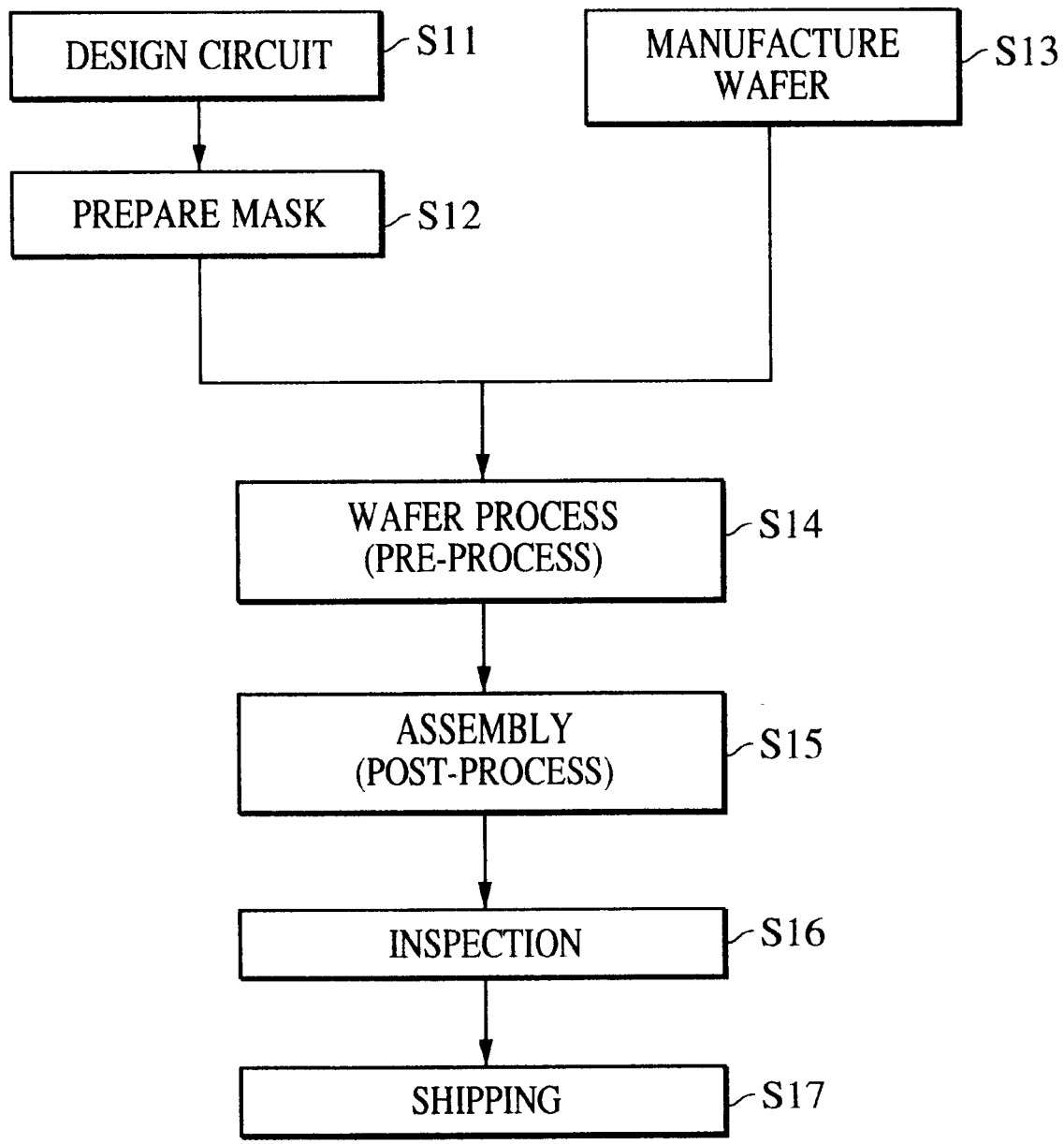
FIG. 8 is a flow chart of a semiconductor device manufacturing method.

An embodiment of a method of manufacturing a semiconductor device by the utilization of the aforementioned exposure apparatus will now be described. FIG. 8 illustrates a flow chart for manufacturing a semiconductor device (e.g., a) semiconductor chip, such as an IC or an LSI, a liquid crystal panel, a CCD, a thin-film magnetic head, or a micro-machine). At step S11 (circuit design), circuits for the semiconductor device are designed. At step S12 (manufacture of a mask), a mask having a circuit pattern thus designed and formed thereon is manufactured. At step S13 (manufacture of a wafer), on the other hand, a wafer serving as a substrate is manufactured by the use of a material such as silicon. At step S14 (wafer process), called a pre-process, an actual circuit is formed on the wafer by lithography, by the use of the thus manufactured mask and wafer. In the next step S15 (assembly), called a post-process, a semiconductor chip is produced by the use of the wafer manufactured at step S14, and includes an assembly step (dicing, bonding), a packaging step (sealing of a chip) and the like. At step S16 (inspection), an operation confirming test, a durability test and other inspections are carried out on the semiconductor device manufactured at step S15. Through these steps, the semiconductor devices are completed and shipped (step S17).

Figure 9:
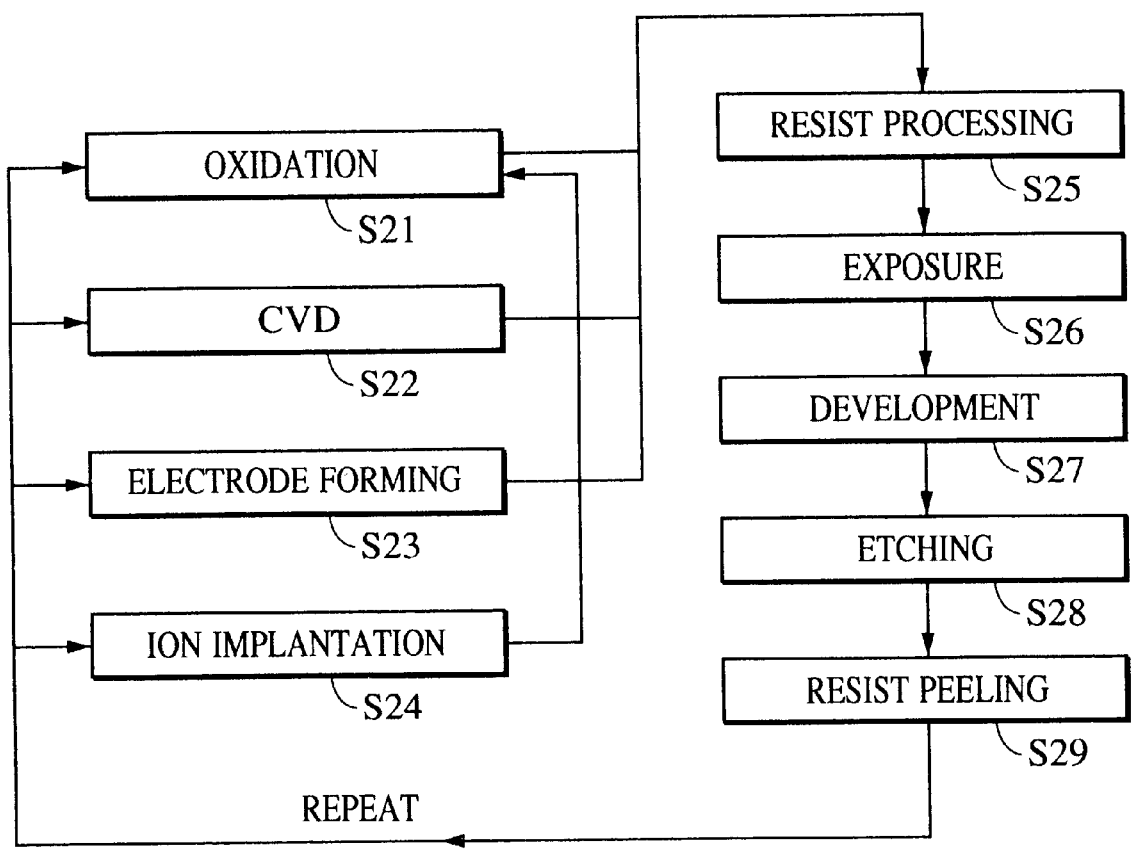
FIG. 9 is a flowchart of a wafer process used in the semiconductor device manufacturing method.
Figure 10:
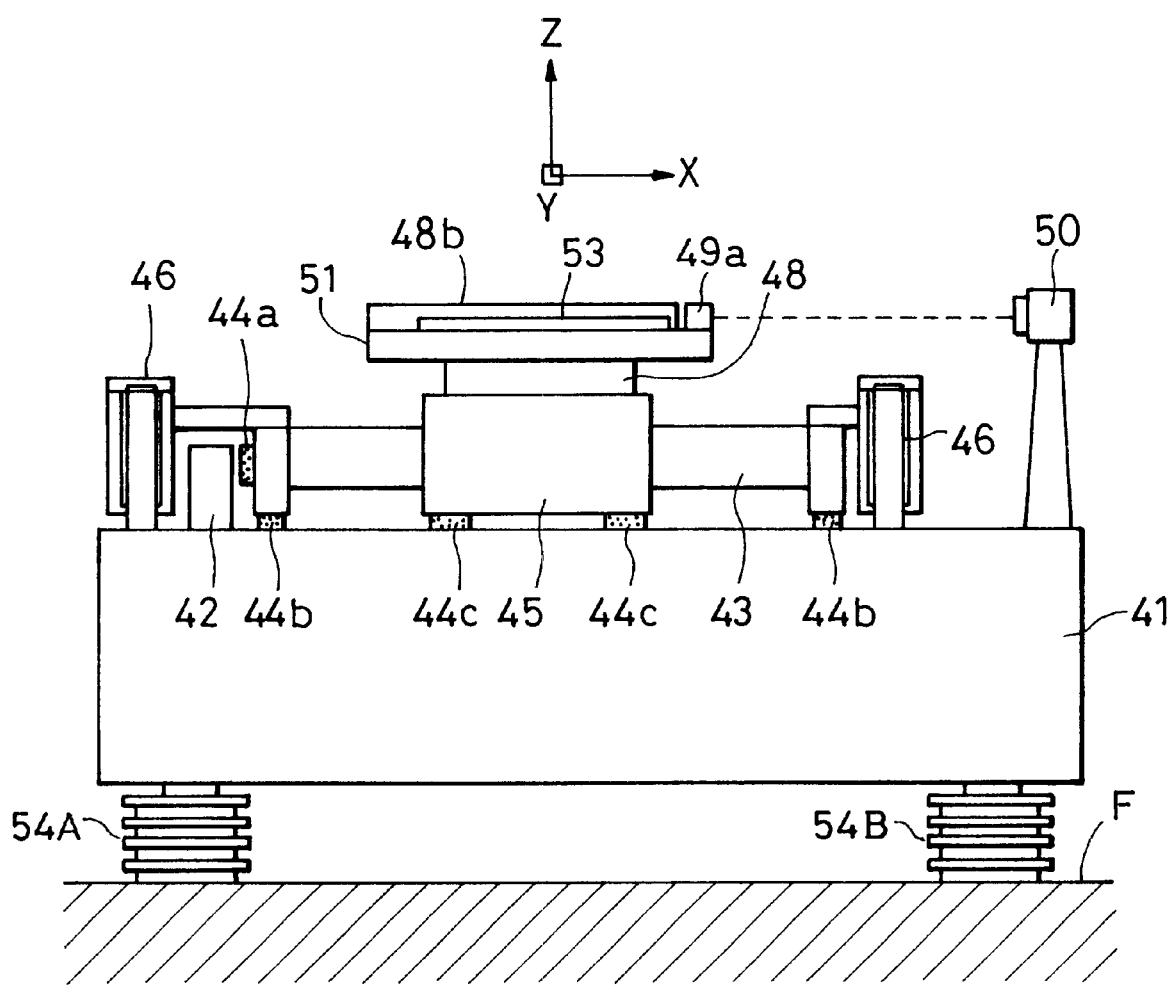
FIG. 10 is a schematic view of a conventional stage apparatus.

FIG. 9 illustrates a detailed flow chart of the aforementioned wafer process. At step S21 (oxidation), the wafer surface is oxidized. At step S22 (chemical vapor deposition—CVD), an insulating film is formed on the wafer surface. At step S23 (forming electrodes), electrodes are formed on the wafer by vapor deposition. At step S24 (ion implantation), ions are implanted into the wafer. At step S25 (resist processing), a photosensitive agent is coated onto the wafer. At step S26 (exposure), the circuit pattern described above is printed on the wafer and exposed by the exposure apparatus described above. At step S27 (development), the exposed wafer is developed. At step S28 (etching), portions other than the developed resist image are scraped off. At step S29 (resist peeling), any portions of the resist becoming unnecessary after the completion of etching are removed. By repeating these steps, multiple circuit patterns are formed on the wafer. According to the manufacturing method of this embodiment, it is possible to manufacture a semiconductor device having a high degree of integration.

Except as otherwise disclosed herein, the various components shown in outline or in block form in the figures are individually well known and their internal construction and operation are not critical either to the making or using of this invention or to a description of the best mode of the invention.

While the present invention has been described with respect to what is at present considered to be the preferred embodiments, it is to be understood that the invention is not limited to the disclosed embodiments. To the contrary, the invention is intended to cover various modifications and equivalent arrangements included within the spirit and scope of the appended claims. The scope of the following claims is to be accorded the broadest interpretation so as to encompass all such modifications and equivalent structures and functions.

What is claimed is:

1. A stage apparatus comprising:
   a base having a reference plane;
   a stage mounted on said base;
   a plurality of static-pressure bearings forming a gap between the reference plane and said stage;
   a plurality of electromagnets producing a preload between said stage and the reference plane opposed by a pressure of the plurality of static-pressure bearings;
   a guideless motor for producing a driving force between said base and said stage; and a controller for controlling driving of said state by (i) said guideless motor in a direction within the reference plane, and (ii) driving of said electromagnets in a direction perpendicular to the reference plane and a tilting direction.

2. A stage apparatus according to claim 1, wherein said stage has a monolithic structure.

3. A stage apparatus according to claim 1, further comprising a measuring instrument provided substantially integrally with said base.

4. A stage apparatus according to claim 1, further comprising a measuring instrument using a member from which vibration has been eliminated from said base as a reference.

5. A stage apparatus according to claim 1, further comprising a measuring instrument for measuring a position of said stage in a direction within the reference plane.

6. A stage apparatus according to claim 1, further comprising a measuring instrument for measuring a position of said stage in one of a direction perpendicular to the reference plane and a tilting direction.

7. A stage apparatus according to claim 6, wherein a change in the thrust produced by said guideless motor is estimated on the basis of an output of said measuring instrument, and said controller controls at least one of an estimated thrust value of said guideless motor and a preload of said electromagnets.

8. A stage apparatus according to claim 1, further comprising a gap gauge for measuring a gap between the reference plane and said stage.

9. A stage apparatus according to claim 1, wherein said controller controls a position of said stage in a direction perpendicular to the reference plane and in a tilting direction by controlling said electromagnets.

10. A stage apparatus according to claim 9, wherein said controller sends an instruction value to said electromagnets based on a sum of a certain offset value and a control instructing value.

11. A stage apparatus according to claim 1, wherein said plurality of electromagnets are at least three in number.

12. A stage apparatus according to claim 1, wherein said controller controls driving of said stage by said plurality of electromagnets while a supply of air to said plurality of static-pressure bearings is maintained constant.

13. A stage apparatus according to claim 1, wherein said guideless motor is an induction motor using said base as a stator.

14. A stage apparatus according to claim 13, wherein said base has a conductive layer and a magnetic layer formed thereunder.

15. A stage apparatus according to claim 1, wherein said guideless motor is a flat pulse motor using said base as a stator.

16. An exposure apparatus comprising:
a base having a reference plane;
a stage mounted on said base;
a plurality of static-pressure bearings forming a gap between the reference plane and said stage;
a plurality of electromagnets producing a preload between said stage and the reference plane opposed by a pressure of the plurality of static-pressure bearings;
a guideless motor for producing a driving force between said base and said stage;
a controller for controlling driving of said stage by (i) said guideless motor in a direction within the reference plane, and (ii) said electromagnets in a direction perpendicular to the reference plane and a tilting direction; and
an exposure apparatus for exposing a device held by said stage.

17. An exposure apparatus according to claim 16, wherein said stage has a monolithic structure.

18. An exposure apparatus according to claim 16, further comprising a measuring instrument provided substantially integrally with said base.

19. An exposure apparatus according to claim 16, further comprising a measuring instrument using a member from which vibration has been eliminated from said base as a reference.

20. An exposure apparatus according to claim 16, further comprising a measuring instrument for measuring a position of said stage in a direction within the reference plane.

21. An exposure apparatus according to claim 16, further comprising a measuring instrument for measuring a position of said stage in one of a direction at right angles to the reference plane and in a tilting direction.

22. An exposure apparatus according to claim 21, wherein a change in the thrust produced by said guideless motor is estimated on the bases of an output of said measuring instrument, and said controller controls at least one of an estimated thrust value of said guideless motor and a preload of said electromagnets.

23. An exposure apparatus according to claim 16, further comprising a gap gauge for measuring a gap between the reference plane and said stage.

24. An exposure apparatus according to claim 16, wherein said guideless motor is a flat pulse motor using said base as a stator.

25. A device manufacturing method comprising:
providing a base having a reference plane;
mounting a stage on the base;
forming a gap between the reference plane and the stage by a plurality of static-pressure bearings;
producing a preload between the stage and the reference plane by a plurality of electromagnets opposed by a pressure of the plurality of static-pressure bearings;
producing a driving force between the base and the stage by a guideless motor;
controlling, using a controller, driving of the stage by (i) the guideless motor in a direction within the reference plane, and (ii) the electromagnets in a direction perpendicular to the reference plane and a tilting direction; and
exposing a wafer, mounted on the stage, to a pattern on a mask, to produce a device.

26. A device manufacturing method according to claim 25, wherein the stage has a monolithic structure.

27. A device manufacturing method according to claim 25, further comprising providing a measuring instrument substantially integrally with the base.

28. A device manufacturing method according to claim 25, further comprising providing a measuring instrument using a member from which vibration has been eliminated from the base as a reference.

29. A device manufacturing method according to claim 25, further comprising providing a measuring instrument for measuring a position of the stage in a direction within the reference plane.

30. A device manufacturing method according to claim 25, further comprising providing a measuring instrument for measuring a position of the stage in one of a direction at right angles to the reference plane and in a tilting direction.

31. A device manufacturing method according to claim 30, wherein a change in the thrust produced by the guideless motor is estimated on the basis of an output of the measuring instrument, and said controlling step controls at least one of an estimated thrust value of the guideless motor and a preload of the electromagnets.

32. A device manufacturing method according to claim 25, further comprising providing a gap gauge for measuring a gap between the reference plane and the stage.

33. A device manufacturing method according to claim 25, wherein the guideless motor is a flat pulse motor using the base as a stator.

* * * * *

UNITED STATES PATENT AND TRADEMARK OFFICE
CERTIFICATE OF CORRECTION

PATENT NO. : 6,359,677 B2
DATED : March 19, 2002
INVENTOR(S) : Hiroshi Itoh et al.

It is certified that error appears in the above-identified patent and that said Letters Patent is hereby corrected as shown below:

<u>Column 9,</u>
Line 67, "a)" should read -- a --.

<u>Column 11,</u>
Line 1, "state" should read -- stage --.

<u>Column 12,</u>
Line 23, "bases" should read -- basis --.

<u>Column 13,</u>
Line 6, "in" should be deleted.

Signed and Sealed this

Fourth Day of June, 2002

*Attest:*

*Attesting Officer*

JAMES E. ROGAN
*Director of the United States Patent and Trademark Office*